United States Patent
Wang

(10) Patent No.: US 11,146,215 B2
(45) Date of Patent: Oct. 12, 2021

(54) DOHERTY POWER AMPLIFIER, CONTROLLING METHOD AND DEVICE

(71) Applicant: Telefonaktiebolaget LM Ericsson (publ), Stockholm (SE)

(72) Inventor: Zhancang Wang, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/649,689

(22) PCT Filed: Oct. 19, 2017

(86) PCT No.: PCT/CN2017/106865
§ 371 (c)(1),
(2) Date: Mar. 23, 2020

(87) PCT Pub. No.: WO2019/075694
PCT Pub. Date: Apr. 25, 2019

(65) Prior Publication Data
US 2020/0259460 A1  Aug. 13, 2020

(51) Int. Cl.
*H03F 1/02* (2006.01)
*H03F 3/19* (2006.01)
*H03F 3/21* (2006.01)

(52) U.S. Cl.
CPC .............. *H03F 1/0288* (2013.01); *H03F 3/19* (2013.01); *H03F 3/211* (2013.01); *H03F 2200/36* (2013.01)

(58) Field of Classification Search
CPC .......... H03F 1/0288; H03F 3/19; H03F 3/211; H03F 2200/36

USPC .......................................................... 330/295
See application file for complete search history.

(56) References Cited

U.S. PATENT DOCUMENTS

| | | | |
|---|---|---|---|
| 2004/0222848 A1* | 11/2004 | Shih | H03F 3/602 330/66 |
| 2009/0167438 A1 | 7/2009 | Yang et al. | |
| 2012/0092074 A1 | 4/2012 | Yanduru et al. | |
| 2015/0295542 A1 | 10/2015 | Moronval et al. | |

FOREIGN PATENT DOCUMENTS

| | | |
|---|---|---|
| CN | 101510763 A | 8/2009 |
| CN | 201398180 Y | 2/2010 |

(Continued)

OTHER PUBLICATIONS

Cho et al. "Compact Design of Linear Doherty Power Amplifier With Harmonic Control for Handset Applications", Proceedings of the 10th European Microwave Integrated Circuits Conference, Sep. 7-8, 2015, Paris, France, pp. 37-40 (Year: 2015).*

(Continued)

*Primary Examiner* — Hafizur Rahman
(74) *Attorney, Agent, or Firm* — Murphy, Bilak & Homiller, PLLC

(57) ABSTRACT

Disclosed are a Doherty power amplifier (2), a controlling method and a device. In the Doherty power amplifier (2), the even order harmonic components can be fed to the drain of the amplifier to realize even order harmonic modulation. The even order harmonic components have higher power level than the odd order harmonic components, therefore, higher efficiency could be achieved.

20 Claims, 5 Drawing Sheets

(56) References Cited

FOREIGN PATENT DOCUMENTS

JP  2011229122 A  11/2011
WO  2017001004 A1  1/2017

OTHER PUBLICATIONS

Colantonio, Paolo, et al., "GaN Doherty Amplifier With Compact Harmonic Traps", Proceedings of the 3rd European Microwave Integrated Circuits Conference, Amsterdam, The Netherlands, Oct. 2008, 526-529.

Eccleston, K. W., et al., "A Compact Class-F/Class-C Doherty Amplifier", Microwave and Optical Technology Letters / vol. 53, No. 7, Jul. 2011, pp. 1-5.

Eccleston, K. W., et al., "Harmonic load modulation in Doherty amplifiers", Electronics Letters; vol. 44 No. 2, Jan. 17, 2008, pp. 1-2.

\* cited by examiner

DOHERTY POWER AMPLIFIER, CONTROLLING METHOD AND DEVICE

TECHNICAL FIELD

Embodiments of the present disclosure generally relate to a field of communication, and more particularly, to a Doherty power amplifier, a controlling method, and a device.

BACKGROUND

Harmonic termination has been widely used for compound semiconductor Power Amplifiers (PAs). However, the complexity of harmonic control circuitry may require great efforts for development and verification.

Therefore, there are certain efforts for improving the efficiency performance of Doherty PAs by harmonic load modulation technology, which does not require harmonic control circuitry and simplifies the development of high efficiency PA.

This section introduces aspects that may facilitate a better understanding of the disclosure. Accordingly, the statements of this section are to be read in this light and are not to be understood as admissions about what is in the prior art or what is not in the prior art.

SUMMARY

The summary is provided to introduce a selection of concepts in a simplified form that are further described below in detailed description. This summary is not intended to identify key features or essential features of the claimed subject matter, nor is it intended to be used to limit the scope of the claimed subject matter.

One of the objects of the disclosure is to provide an effective solution for achieving higher efficiency at Doherty Power Amplifier.

In view of the above, one or more methods, devices are provided in the present disclosure. Various embodiments of the present disclosure mainly aim at providing methods, and device for realizing harmonic load modulation in a Doherty PA. Other features and advantages of the embodiments of the present disclosure will also be understood from the following description of particular embodiments when read in conjunction with the accompanying drawings, which illustrate, by way of example, the principles of embodiments of the present disclosure.

In general, the embodiments of the present disclosure provide a solution for realizing even order harmonic load modulation.

In a first aspect, a Doherty Power Amplifier is provided, the Doherty Power Amplifier includes at least a first amplifier and a second amplifier, the Doherty Power Amplifier further includes a first transmission device and a second a second transmission device. The first transmission device is configured to feed first even order harmonic components generated at a drain of the first amplifier to a drain of the second amplifier and then short the first even order harmonic components to ground. The second transmission device is configured to feed second even order harmonic components generated at the drain of the second amplifier to the drain of the first amplifier and then short the second even order harmonic components to ground.

In an embodiment, the first transmission device includes a first quarter wave length transmission line ($TL_{d0}$) which is configured to couple the drain of the first amplifier and the drain of the second amplifier and feed the first even order harmonic components to the drain of the second amplifier.

In an embodiment, the first transmission device further includes a second quarter wavelength transmission line ($TL_{mp}$) which is configured to couple the drain of the second amplifier and an output terminal of the second amplifier; and a third quarter wavelength transmission line ($TL_p$) which is configured to couple the output terminal of the second amplifier and ground by connecting in series with a first capacitor ($C_4$). The first even order harmonic components are shorted to ground through a signal path via the first quarter wavelength transmission line ($TL_{d0}$), the second quarter wavelength transmission line ($TL_{mp}$), the third quarter wavelength transmission line ($TL_p$), and the first capacitor ($C_4$).

In an embodiment, the second transmission device includes the first quarter wavelength transmission line ($TL_{d0}$), the first quarter wavelength transmission line ($TL_{d0}$) is further configured to feed the second even order harmonic components to the drain of the first amplifier.

In an embodiment, the second transmission device further includes a fourth quarter wavelength transmission line ($TL_{mm}$) which is configured to couple the drain of the first amplifier and an output terminal of the first amplifier; and a fifth quarter wavelength transmission line ($TL_m$) which is configured to couple the output terminal of the first amplifier and ground by connecting in series with a second capacitor ($C_3$), the second even order harmonic components are shorted to ground through a signal path via the first quarter wavelength transmission line ($TL_{d0}$), the fourth quarter wavelength transmission line ($TL_{mm}$), the fifth quarter wavelength transmission line ($TL_m$), and the second capacitor ($C_3$).

In an embodiment, the first odd order harmonic components generated at the drain of the first amplifier are shorted to ground through a signal path via the fourth quarter wavelength transmission line ($TL_{mm}$), the fifth quarter wavelength transmission line ($TL_m$), and the second capacitor ($C_3$); second odd order harmonic components generated at the drain of the second amplifier are shorted to ground through a signal path via the second quarter wavelength transmission line ($TL_{mp}$), the third quarter wavelength transmission line ($TL_p$), and the first capacitor ($C_4$).

In an embodiment, the Doherty Power Amplifier further includes a combiner which is configured to combine a first output signal at the output terminal of the first amplifier and a second output signal at the output terminal of the second amplifier.

In an embodiment, the combiner includes a sixth quarter wavelength transmission line ($TL_{d1}$) which is configured to couple the output terminal of the first amplifier and the output terminal of the second amplifier by connecting in series with a third capacitor ($C_1$).

In an embodiment, the Doherty Power Amplifier further includes a hybrid coupler which is configured to split an input radio frequency signal into two signals, and feed the two signals to the first amplifier and the second amplifier with predetermined power ratio, respectively.

In a second aspect, a method is provided. The method is corresponding to the Doherty PA in the first aspect.

In a third aspect, a device is provided, the device includes the Doherty Power Amplifier in the first aspect.

According to various embodiments of the present disclosure, even order harmonic components can be fed to the drain of the amplifier to realize even order harmonic modulation. The even order harmonic components have higher power level than the odd order harmonic components, therefore, higher efficiency could be achieved in Doherty Power Amplifier.

BRIEF DESCRIPTION OF THE DRAWINGS

The above and other aspects, features, and benefits of various embodiments of the disclosure will become more fully apparent, by way of example, from the following detailed description with reference to the accompanying drawings, in which like reference numerals or letters are used to designate like or equivalent elements. The drawings are illustrated for facilitating better understanding of the embodiments of the disclosure and not necessarily drawn to scale, in which.

DETAILED DESCRIPTION

Figure 1:
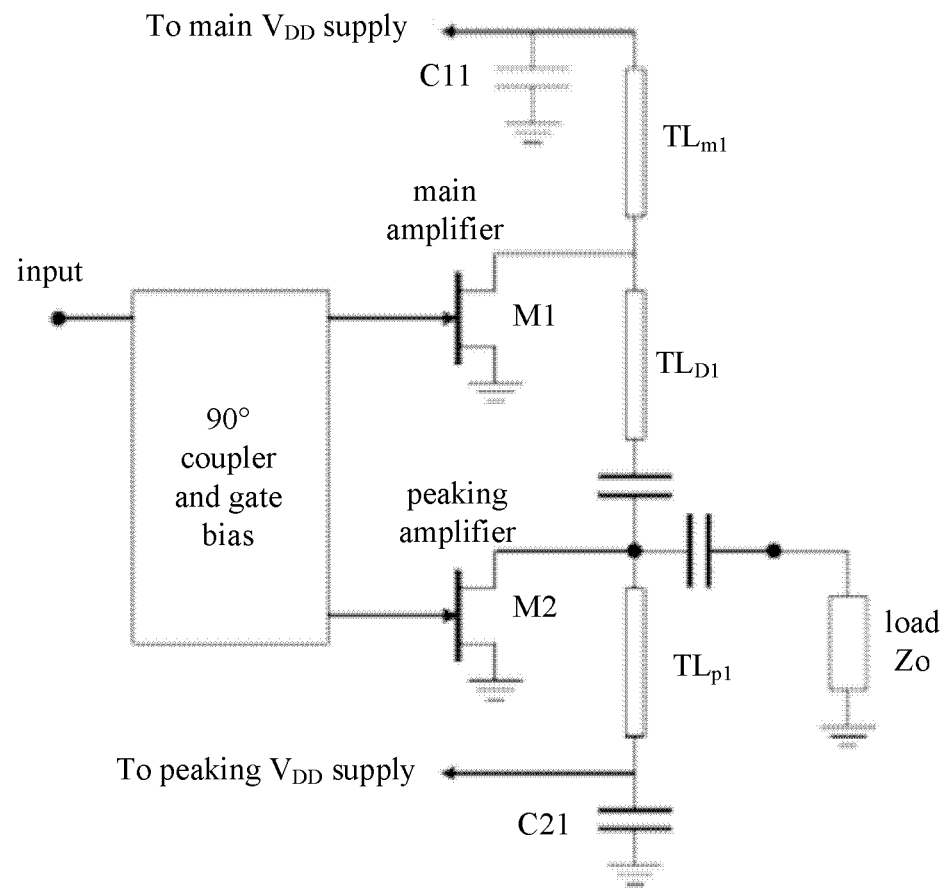
FIG. 1 shows a schematic diagram of related art to realize odd-harmonic load modulation.

The present disclosure will now be described with reference to several exemplary embodiments. It should be understood that these embodiments are discussed only for the purpose of enabling those skilled persons in the art to better understand and thus implement the present disclosure, rather than suggesting any limitations on the scope of the present disclosure.

In the following description, details are given to provide thorough understanding of the various aspects of the disclosure. However, it will be understood by one of ordinary skill in the art that the aspects may be practiced without these details. For example, circuits may be shown in block diagrams in order to avoid obscuring the aspects in unnecessary detail. In other instances, well-known circuits, structures and techniques may not be shown in detail in order not to obscure the aspects of the disclosure.

As used herein, the term "wireless communication network" refers to a network following any suitable communication standards, such as LTE-Advanced (LTE-A), LTE, Wideband Code Division Multiple Access (WCDMA), High-Speed Packet Access (HSPA), and so on. Furthermore, the communications between a terminal device and a network device in the wireless communication network may be performed according to any suitable generation communication protocols, including, but not limited to, Global System for Mobile Communications (GSM), Universal Mobile Telecommunications System (UMTS), Long Term Evolution (LTE), and/or other suitable, and/or other suitable the first generation (1G), the second generation (2G), 2.5G, 2.75G, the third generation (3G), the fourth generation (4G), 4.5G, the future fifth generation (5G) communication protocols, wireless local area network (WLAN) standards, such as the IEEE 802.11 standards; and/or any other appropriate wireless communication standard, such as the Worldwide Interoperability for Microwave Access (WiMax), Bluetooth, and/or ZigBee standards, and/or any other protocols either currently known or to be developed in the future.

The term "network device" refers to a device in a wireless communication network via which a terminal device accesses the network and receives services therefrom. The network device refers a base station (BS), an access point (AP), or any other suitable device in the wireless communication network. The BS may be, for example, a node B (NodeB or NB), an evolved NodeB (eNodeB or eNB), or gNB, a Remote Radio Unit (RRU), a radio header (RH), a remote radio head (RRH), a relay, a low power node such as a femto, a pico, and so forth. Yet further examples of the network device may include multi-standard radio (MSR) radio equipment such as MSR BSs, network controllers such as radio network controllers (RNCs) or base station controllers (BSCs), base transceiver stations (BTSs), transmission points, transmission nodes. More generally, however, the network device may represent any suitable device (or group of devices) capable, configured, arranged, and/or operable to enable and/or provide a terminal device access to the wireless communication network or to provide some service to a terminal device that has accessed the wireless communication network.

The term "terminal device" refers to any end device that can access a wireless communication network and receive services therefrom. By way of example and not limitation, the terminal device refers to a mobile terminal, user equipment (UE), or other suitable devices. The UE may be, for example, a Subscriber Station (SS), a Portable Subscriber Station, a Mobile Station (MS), or an Access Terminal (AT). The terminal device may include, but not limited to, portable computers, image capture terminal devices such as digital cameras, gaming terminal devices, music storage and playback appliances, a mobile phone, a cellular phone, a smart phone, voice over IP (VoIP) phones, wireless local loop phones, a tablet, a wearable device, a personal digital assistant (PDA), portable computers, desktop computer, image capture terminal devices such as digital cameras, gaming terminal devices, music storage and playback appliances, wearable terminal devices, vehicle-mounted wireless terminal devices, wireless endpoints, mobile stations, laptop-embedded equipment (LEE), laptop-mounted equipment (LME), USB dongles, smart devices, wireless customer-premises equipment (CPE) and the like. In the following description, the terms "terminal device", "terminal", "user equipment" and "UE" may be used interchangeably.

As one example, a terminal device may represent a UE configured for communication in accordance with one or more communication standards promulgated by the 3rd Generation Partnership Project (3GPP), such as 3GPP's GSM, UMTS, LTE, and/or 5G standards. As used herein, a "user equipment" or "UE" may not necessarily have a "user" in the sense of a human user who owns and/or operates the relevant device. In some embodiments, a terminal device may be configured to transmit and/or receive information without direct human interaction. For instance, a terminal device may be designed to transmit information to a network on a predetermined schedule, when triggered by an internal or external event, or in response to requests from the wireless communication network. Instead, a UE may represent a device that is intended for sale to, or operation by, a human user but that may not initially be associated with a specific human user.

The terminal device may support device-to-device (D2D) communication, for example by implementing a 3GPP standard for sidelink communication, and may in this case be referred to as a D2D communication device.

As yet another example, in an Internet of Things (IOT) scenario, a terminal device may represent a machine or other device that performs monitoring and/or measurements, and transmits the results of such monitoring and/or measurements to another terminal device and/or network equipment. The terminal device may in this case be a machine-to-machine (M2M) device, which may in a 3GPP context be referred to as a machine-type communication (MTC) device. As one particular example, the terminal device may be a UE implementing the 3GPP narrow band internet of things (NB-IoT) standard. Particular examples of such machines or devices are sensors, metering devices such as power meters, industrial machinery, or home or personal appliances, for example refrigerators, televisions, personal wearable such as watches etc. In other scenarios, a terminal device may represent a vehicle or other equipment that is capable of monitoring and/or reporting on its operational status or other functions associated with its operation.

References in the specification to "one embodiment," "an embodiment," "an example embodiment," and the like indicate that the embodiment described may include a particular feature, structure, or characteristic, but it is not necessary that every embodiment includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It shall be understood that although the terms "first" and "second" etc. may be used herein to describe various elements, these elements should not be limited by these terms. These terms are only used to distinguish one element from another. For example, a first element could be termed a second element, and similarly, a second element could be termed a first element, without departing from the scope of example embodiments. As used herein, the term "and/or" includes any and all combinations of one or more of the associated listed terms.

The terminology used herein is for the purpose of describing particular embodiments only and is not intended to be liming of example embodiments. As used herein, the singular forms "a", "an" and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof.

In the following description and claims, unless defined otherwise, all technical and scientific terms used herein have the same meaning as commonly understood by one of ordinary skills in the art to which this disclosure belongs.

Before describing the examples illustratively depicted in the several figures, a general introduction is provided for further understanding. With the above general understanding borne in mind, various embodiments are generally described below. Now some exemplary embodiments of the present disclosure will be described below with reference to the figures.

FIG. 1 shows a schematic diagram of related art to realize odd-harmonic load modulation. As shown in FIG. 1, M1 denotes to a Field Effect Transistor (FET) of main amplifier, M2 denotes to a Field Effect Transistor (FET) of peaking amplifier.

The main amplifier originally behaved like a class-AB/-B mode amplifier, in which main $V_{DD}$ supply is connected to a drain of M1 through a quarter wavelength transmission line $TL_{m1}$. The peaking amplifier originally behaved like a class-C mode amplifier, in which peaking $V_{DD}$ supply is connected to a drain of M2 through a quarter wavelength transmission line $TL_{p1}$. The drain of M1 and the drain of M2 are coupled by a quarter wavelength transmission line $TL_{D1}$.

As shown in FIG. 1, even order harmonic components generated at the drain of M1 will flow to ground via the quarter wavelength transmission line $TL_{m1}$ and a capacitor C11.

As shown in FIG. 1, even order harmonic components generated at the drain of M2 will be shorted to ground via the quarter wavelength transmission line $TL_{p1}$ and a capacitor $C_{21}$.

As shown in FIG. 1, odd order harmonic components generated at the drain of M2 will be fed to the drain of M1 via the quarter wavelength transmission line $TL_{D1}$, and then flow to ground via the quarter wavelength transmission line $TL_{m1}$ and the capacitor C11.

The biggest advantage of the Doherty PA in FIG. 1 is that the odd harmonic components of the peaking amplifier flow into the main amplifier will make the main amplifier behave like a class-F mode amplifier without individual harmonic control circuitry, thus odd harmonic load modulation is realized in Doherty PA. Therefore, high efficiency could be achieved by a simplified and compact circuit.

However, the related art shown in FIG. 1 has at least the following problems:

(1). The odd order harmonic components contributes in harmonic termination, thus power added efficiency is quite limited due to limited power level of odd order harmonic components when compared to even order harmonic components.

(2). Even order harmonic components, especially the 2nd order harmonic component can contribute a lot for harmonic termination due to high power level. However, even order harmonic components are shorted to ground in related art. It would be a kind of waste of resource.

(3). Although class-F produced by odd harmonic load modulation effect in related art can achieve high efficiency, an effect of output parasitic of M1 will reduce the quality of odd-harmonic short-circuit termination at M2, resulting in degradation of efficiency.

To solve the problems above, a Doherty Power Amplifier, a method and a device are provided in the present disclosure, for realizing even order harmonic load modulation at a Doherty PA.

A First Aspect of Embodiments

A Doherty Power Amplifier is provided in these embodiments.

Figure 2:
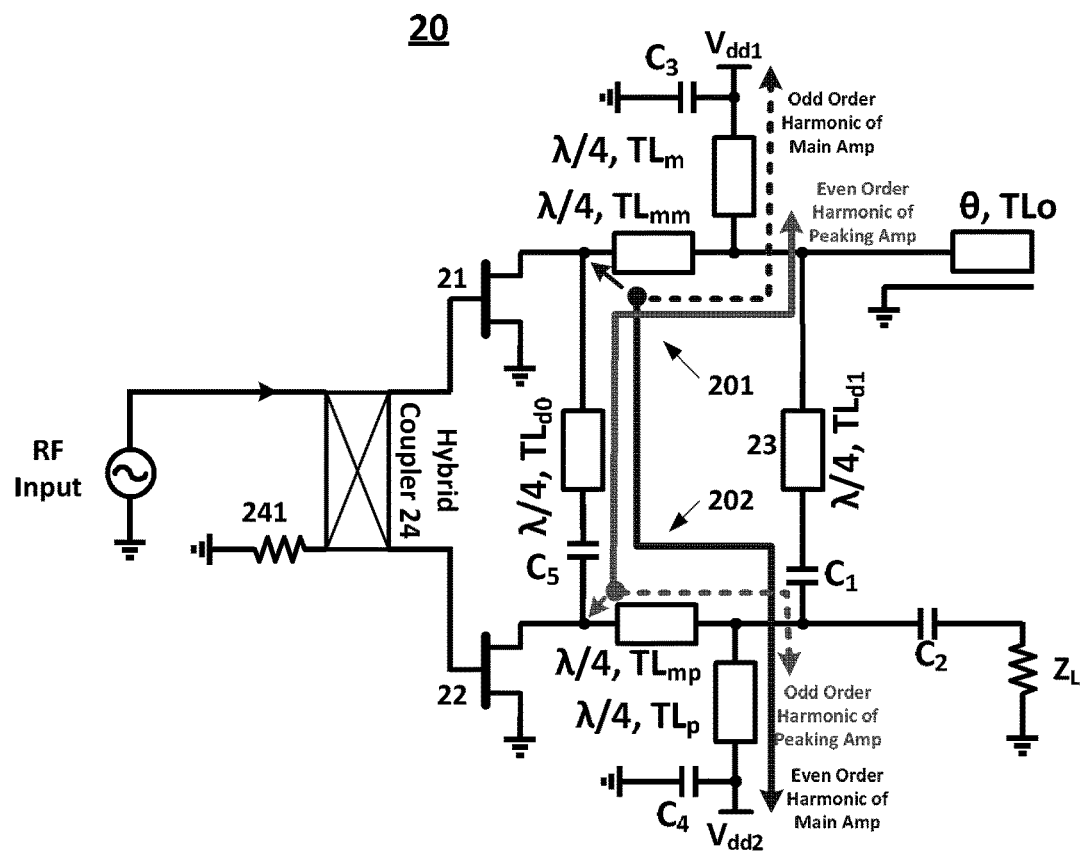
FIG. 2 shows a Doherty Power Amplifier in accordance with an embodiment of the present disclosure.

FIG. 2 shows a Doherty Power Amplifier in accordance with an embodiment of the present disclosure. As shown in FIG. 2, a Doherty Power Amplifier 20 includes at least a first amplifier 21 and a second amplifier 22.

In an embodiment, the Doherty Power Amplifier 20 may further include a first transmission device 201 and a second transmission device 202.

The first transmission device 201 is configured to feed first even order harmonic components generated at a drain of the first amplifier 21 to a drain of the second amplifier 22, and then short the first even order harmonic components to ground.

The second transmission device 202 is configured to feed second even order harmonic components generated at the drain of the second amplifier 22 to the drain of the first amplifier 21, and then short the second even order harmonic components to ground.

According to the embodiment, even order harmonic components can be fed to the drain of the amplifier to realize even order harmonic modulation. The even order harmonic components (e.g. the $2^{nd}$ order harmonic component) has higher power level than the odd order harmonic components (e.g. the 3rd order harmonic component), therefore, higher efficiency could be achieved than related art, in which odd order harmonic load modulation is realized.

In the embodiment, as shown in FIG. 2, the Doherty Power Amplifier 20 may be in non-inverted (or standard) Doherty form, and the first amplifier 21 could be main amplifier, the second amplifier 22 could be peaking amplifier. However, the embodiment does not limit to this, for example, the Doherty Power Amplifier 20 could be even Doherty, uneven Doherty, symmetric Doherty, asymmetric Doherty, inverted Doherty or multistage Doherty with more than 2 amplifiers.

In the embodiment, as shown in FIG. 2, the first transmission device 201 may include a first quarter wave length transmission line $TL_{d0}$.

In the embodiment, a quarter wave length transmission line has a length of ¼ λ, where λ is the wave length of fundamental frequency signal of generated at the drain of the first amplifier 201.

In the embodiment, the first quarter wave length transmission line $TL_{d0}$ is configured to couple the drain of the first amplifier 21 and the drain of the second amplifier 22, and feed the first even order harmonic components to the drain of the second amplifier 22.

In the embodiment, the first transmission device 201 may further include: a second quarter wavelength transmission line $TL_{mp}$, and a third quarter wavelength transmission line $TL_p$.

In the embodiment, the second quarter wavelength transmission line $TL_{mp}$ is configured to couple the drain of the second amplifier 22 and an output terminal of the second amplifier 22.

In the embodiment, the third quarter wavelength transmission line $TL_p$ is configured to couple the output terminal of the second amplifier and ground by connecting in series with a first capacitor $C_4$.

In the embodiment, the first quarter wavelength transmission line $TL_{d0}$, the second quarter wavelength transmission line $TL_{mp}$, and the third quarter wavelength transmission line $TL_p$ work as a three-quarter wavelength transmission line, which is equivalent to a quarter wavelength transmission line. Therefore, the first even order harmonic components are shorted to ground through a signal path via the first quarter wavelength transmission line $TL_{d0}$, the second quarter wavelength transmission line $TL_{mp}$, the third quarter wavelength transmission line $TL_p$, and the first capacitor $C_4$.

In the embodiment, the second transmission device 202 may include the first quarter wavelength transmission line $TL_{d0}$.

In the embodiment, the first quarter wavelength transmission line $TL_{d0}$ may also feed the second even order harmonic components to the drain of the first amplifier 21.

In the embodiment, when an input signal of the Doherty PA is small, the second amplifier 22 is turned off, only the first even order harmonic components are fed to the drain of the second amplifier 22. When the input signal becomes larger, the second amplifier 22 is turned on, therefore, the second even order harmonic components are generated at the drain of the second amplifier 22 and fed to the drain of the first amplifier 21.

In the embodiment, the second transmission device 202 further includes: a fourth quarter wavelength transmission line $TL_{mm}$, and a fifth quarter wavelength transmission line $TL_m$.

In the embodiment, the fourth quarter wavelength transmission line $TL_{mm}$ is configured to couple the drain of the first amplifier 21 and an output terminal of the first amplifier 21.

In the embodiment, the fifth quarter wavelength transmission line $TL_{mm}$ is configured to couple the output terminal of the first amplifier 21 and ground by connecting in series with a second capacitor $C_3$.

In the embodiment, the first quarter wavelength transmission line $TL_{d0}$, the fourth quarter wavelength transmission line $TL_{mm}$, and the fifth quarter wavelength transmission line $TL_m$ work as a three-quarter wavelength transmission line, which is equivalent to a quarter wavelength transmission line from impedance transformation perspective. Therefore, the second even order harmonic components are shorted to ground through a signal path via the first quarter wavelength transmission line $TL_{d0}$, the fourth quarter wavelength transmission line $TL_{mm}$, the fifth quarter wavelength transmission line $TL_m$, and the second capacitor $C_3$.

In the embodiment, the fourth quarter wavelength transmission line $TL_{mm}$, and the fifth quarter wavelength transmission line $TL_m$ work as a half wavelength transmission line. Therefore, the first odd order harmonic components generated at the drain of the first amplifier 21 are shorted to ground through a signal path via the fourth quarter wavelength transmission line $TL_{mm}$, the fifth quarter wavelength transmission line $TL_m$, and the second capacitor $C_3$.

In the embodiment, the second quarter wavelength transmission line $TL_{mp}$, and the third quarter wavelength transmission line $TL_p$ work as a half wavelength transmission line. Therefore, the second odd order harmonic components generated at the drain of the second amplifier 22 are shorted to ground through a signal path via the second quarter wavelength transmission line $TL_{mp}$, the third quarter wavelength transmission line $TL_p$, and the first capacitor $C_4$.

In the embodiment, the second amplifier 22 could be biased by a supply $V_{DD2}$ to work in a class-C mode. The first amplifier 21 could be biased by a supply $V_{DD1}$ to originally work in a class-AB/-B mode.

At the drain of the first amplifier 21, the second even order harmonic components from the second amplifier 22 exhibit an open-circuit terminated due to $(TL_m+TL_{mm})$ half wavelength transmission line. Therefore, the first amplifier 21 would behave like a class-$F^{-1}$ mode rather than a class-AB/-B mode.

As shown in FIG. 2, the Doherty Power Amplifier 2 may further include a combiner 23.

In the embodiment, the combiner 23 is configured to combine a first output signal at the output terminal of the first amplifier 21 and a second output signal at the output terminal of the second amplifier 22.

In one embodiment, as shown in FIG. 2, the combiner 23 may include a sixth quarter wavelength transmission line $TL_{d1}$. The sixth quarter wavelength transmission line $TL_{d1}$ is configured to couple the output terminal of the first amplifier 21 and the output terminal of the second amplifier 22 by connecting in series with a third capacitor $C_1$. The sixth quarter wavelength transmission line $TL_{d1}$ may also play a role of an impedance inverter to perform impedance inversion on the first output signal and the second output signal.

As shown in FIG. 2, the Doherty Power Amplifier 2 may further include an open circuited stub TLo. The open circuited stub TLo with a specific electrical length θ has the same impedance as the first amplifier 21 output impedance. The open circuited stub TLo could play a role of offset line. The open circuited stub TLo has the same effect as placing transmission lines of electrical length θ in series with an output matching networks at output terminal of the first amplifier and the second amplifier.

The open circuited stub TLo could be replaced by an equivalent circuit, such a shunt capacitor, inductor or parallel inductance-capacitance (L-C) circuit, whose susceptance could be varied to effectively "tune" the lengths of $TL_{mm}$ and $TL_{mp}$. This tuning can be used to compensate for the inability to accurately predict an optimum θ offset value, and to effectively adjust value of θ as required to compensate for changes in other circuit characteristics.

As shown in FIG. 2, the Doherty Power Amplifier 2 may further include a hybrid coupler 24.

The hybrid coupler 24 may be at input terminal of the Doherty Power Amplifier 2. The hybrid coupler 24 may be configured to split an input radio frequency signal into two signals, and feed the two signals to the first amplifier and the second amplifier with a predetermined power ratio, respectively. For example, the predetermined power ratio could be 1:1.

As shown in FIG. 2, the hybrid coupler 24 may connect to an isolation load 241, which will improve the stability of the hybrid coupler 24.

According to the embodiment, at a fundamental frequency, the first amplifier 21 and the second amplifier 22 interact in a Doherty way so $Z0_{d0}$ (the impedance of $TL_{d0}$) and $Z0_{d1}$ (the impedance of $TL_{d1}$) are set to a proper ratio to match a final load impedance $Z_L$. Since all the odd order harmonic components of both first and second amplifiers are shunted to ground, there is no interaction between the first and second amplifiers at odd order harmonics. Because the even order harmonic components from the second amplifier 22 flow through $TL_{d0}$, $TL_{mm}$ and $TL_m$, the even order harmonic components standing waves are established on $TL_{d0}$ at the drain of the first amplifier 21. Current waveforms of the even order harmonic components have square shapes, therefore, the even order harmonic components fed to the drain of the first amplifier 21 could "square" the first amplifier 21 drain current waveform due to the harmonic load modulation effect, while the first amplifier 21 drain voltage waveforms would be half sine wave like.

Figure 3:
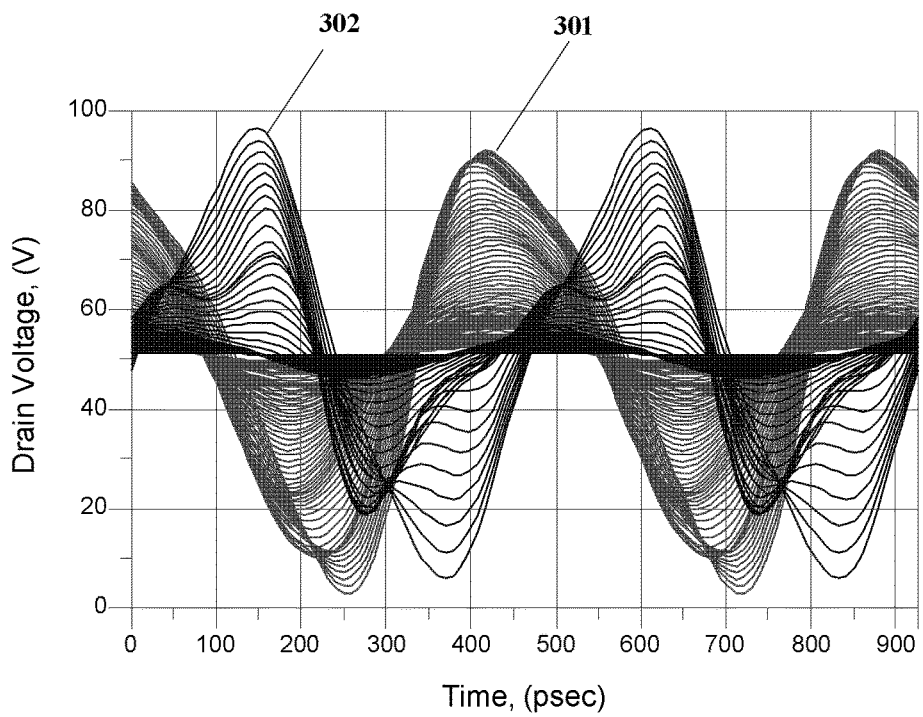
FIG. 3 depicts drain voltage waveforms 301 in the first amplifier and drain voltage waveforms 302 in the second amplifier at 2160 MHz for various input power levels.
Figure 4:
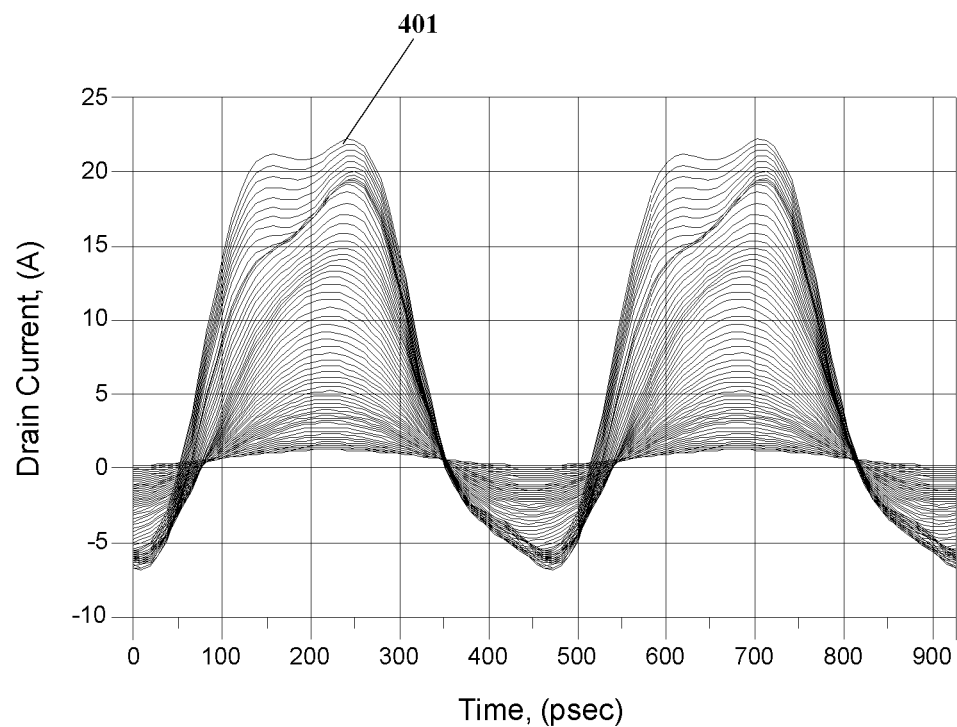
FIG. 4 depicts drain current waveforms in the first amplifier at 2160 MHz for various input power levels.

In the embodiment, the Doherty PA 2 is simulated in 2110~2200 MHz band to show the harmonic load modulation effect. FIG. 3 depicts drain voltage waveforms 301 in the first amplifier and drain voltage waveforms 302 in the second amplifier at 2160 MHz for various input power levels. FIG. 4 depicts drain current waveforms in the first amplifier at 2160 MHz for various input power levels.

FIG. 4 shows the "squaring" effect on the drain current waveforms 401 of the first amplifier (FIG. 4). However, the "squaring" effect does not affect drain voltage waveforms 301 of the first amplifier as shown in FIG. 3. Therefore, it indicates that the effect of even order harmonic load modulation effect in the embodiment is similar to "Class-$F^{-1}$" mode. The efficiency of the Doherty PA is increased by "squaring" the current waveform.

As shown in FIG. 4, even order harmonic components generated in the second amplifier 202 are fed to the first amplifier via a quarter wave length transmission line so that a quasi-class-F-1 operation of the first amplifier could be realized. It is a kind of even order harmonic load modulation without any traditional harmonic terminations.

Figure 5:
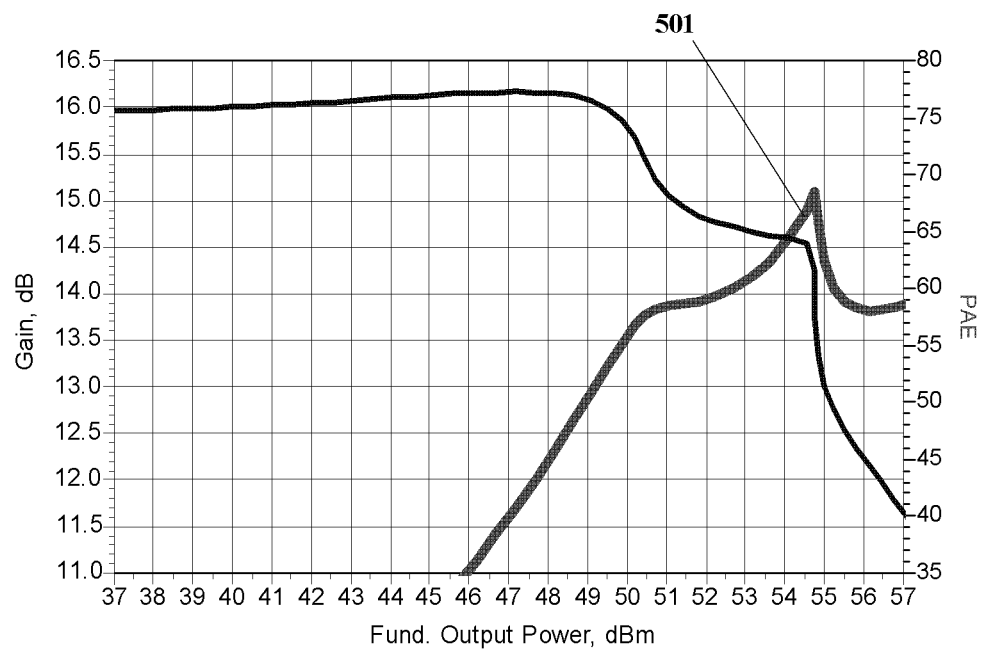
FIG. 5 shows the simulated power added efficiency and fundamental output power of the Doherty Power Amplifier at 2160 MHz.

FIG. 5 shows the simulated power added efficiency and fundamental output power of the Doherty PA at 2160 MHz In FIG. 5, line 501 denote the power added efficiency (PAE). As shown in FIG. 5, line 501 has a peak when the fundamental output power is in a region of 51~57, which means the efficiency in Doherty region could be enhanced due to the interactions of the first amplifier and the second amplifier.

As can be seen from the embodiments, even order harmonic components can be fed to the drain of the amplifier to realize even order harmonic modulation. The even order harmonic components (e.g. the $2^{nd}$ order harmonic component) has higher power than the odd order harmonic components (e.g. the $3^{rd}$ order harmonic component), therefore, higher efficiency could be achieved than related art, in which odd order harmonic modulation is realized.

It is to be understood that the above examples or embodiments are discussed for illustration only, rather than limitation. Those skilled in the art would appreciate that there may be many other embodiments or examples within the scope of the present disclosure.

A Second Aspect of Embodiments

A method at a Doherty Power Amplifier is provided in these embodiments. The Doherty Power Amplifier is provided in the first aspect of embodiments, and the same contents as those in the first aspect of embodiments are omitted.

Figure 6:
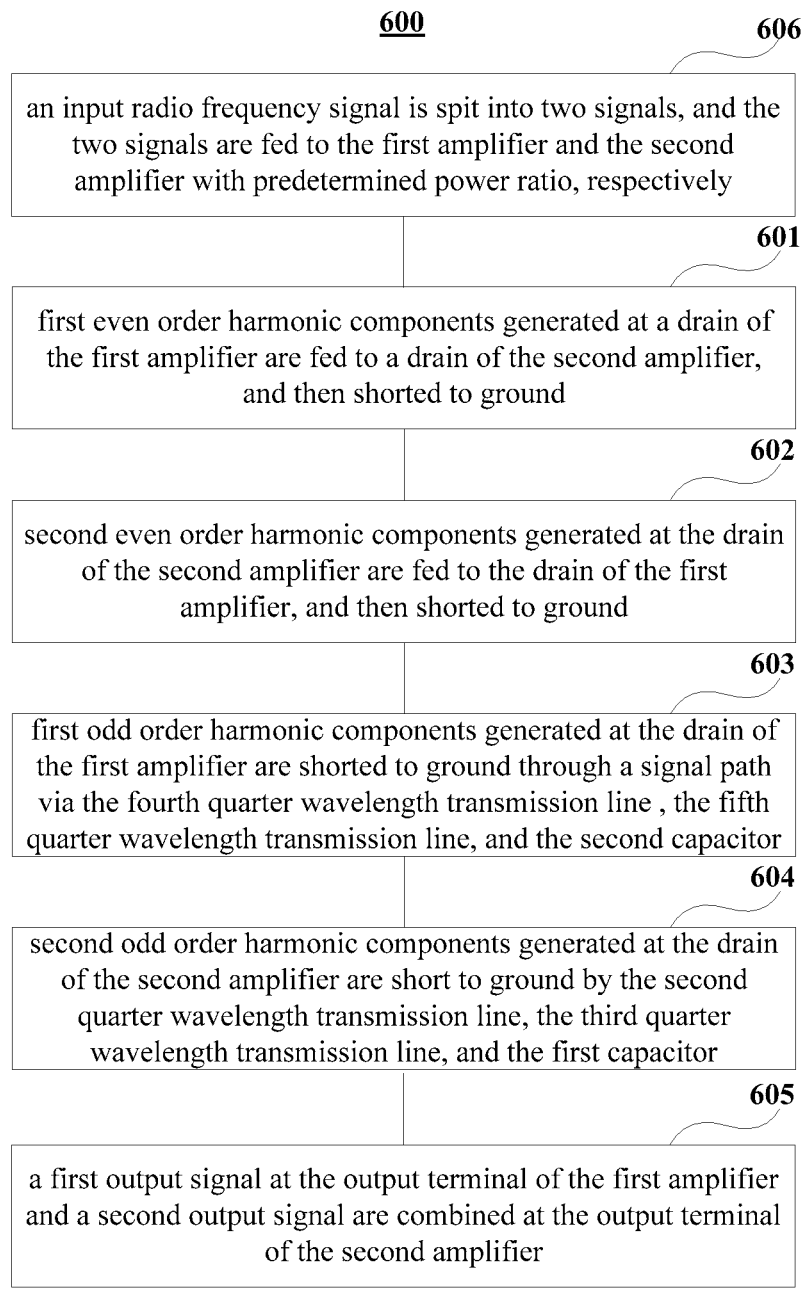
FIG. 6 shows a flowchart of the method 600 implemented at a Doherty Power Amplifier in accordance with the embodiment of the present disclosure.

FIG. 6 shows a flowchart of the method 600 implemented at a Doherty Power Amplifier in accordance with the embodiment of the present disclosure. As shown in FIG. 6, the method 600 includes: Block 601: first even order harmonic components generated at a drain of the first amplifier are fed to a drain of the second amplifier, and then shorted to ground; and Block 602: second even order harmonic components generated at the drain of the second amplifier are fed to the drain of the first amplifier, and then shorted to ground.

In an embodiment, the block 601 may include: the first even order harmonic components are fed to the drain of the second amplifier by a first quarter wavelength transmission line ($TL_{d0}$) coupling the drain of the first amplifier and the drain of the second amplifier, and the first even order harmonic components are shorted to ground through a signal path via the first quarter wavelength transmission line ($TL_{d0}$), a second quarter wavelength transmission line ($TL_{mp}$), a third quarter wavelength transmission line ($TL_p$), and a first capacitor ($C_4$).

In an embodiment, the block 602 may include: the second even order harmonic components are fed to the drain of the first amplifier by the first quarter wavelength transmission line ($TL_{d0}$); and the second even order harmonic components are fed to ground by the first quarter wavelength transmission line ($TL_{d0}$), a fourth quarter wavelength transmission line ($TL_{d0}$), a fifth quarter wavelength transmission line ($TL_{d0}$), and a second capacitor ($C_3$).

As shown in FIG. 6, the method 600 further includes Block 603: first odd order harmonic components generated at the drain of the first amplifier are shorted to ground through a signal path via the fourth quarter wavelength transmission line ($TL_{mm}$), the fifth quarter wavelength transmission line ($TL_m$), and the second capacitor ($C_3$).

As shown in FIG. 6, the method 600 further includes Block 604: second odd order harmonic components generated at the drain of the second amplifier are short to ground by the second quarter wavelength transmission line ($TL_{mp}$), the third quarter wavelength transmission line ($TL_p$), and the first capacitor ($C_4$).

As shown in FIG. 6, the method 600 further includes Block 605: a first output signal at the output terminal of the first amplifier and a second output signal are combined at the output terminal of the second amplifier.

As shown in FIG. 6, the method 600 further includes Block 606: an input radio frequency signal is split into two signals, and the two signals are fed to the first amplifier and the second amplifier with predetermined power ratio, respectively.

As can be seen from the embodiment, even order harmonic components can be fed to the drain of the amplifier to realize even order harmonic modulation. The even order harmonic components (e.g. the $2^{nd}$ order harmonic component) has higher power level than the odd order harmonic components (e.g. the 3rd order harmonic component), therefore, higher efficiency could be achieved than related art, in which the odd order harmonic modulation is realized.

It is to be understood that the above examples or embodiments are discussed for illustration only, rather than limitation. Those skilled in the art would appreciate that there may be many other embodiments or examples within the scope of the present disclosure.

A Third Aspect of Embodiments

A device in a wireless communication system is provided in these embodiments.

Figure 7:
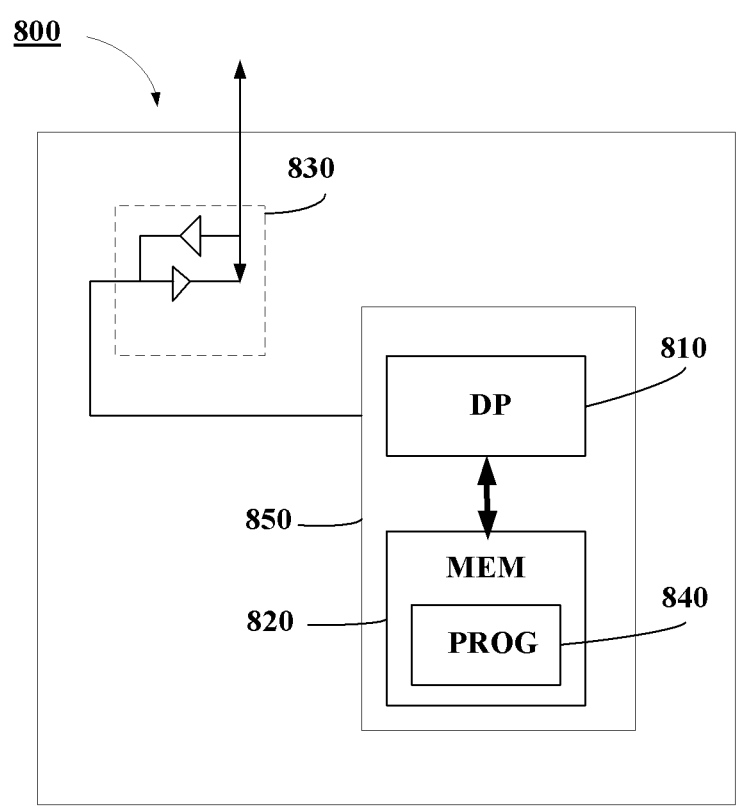
FIG. 7 shows a simplified block diagram of a device 800 in a wireless communication system in accordance with an embodiment of the present disclosure.

FIG. 7 shows a simplified block diagram of a device 800 in a wireless communication system in accordance with an embodiment of the present disclosure. It would be appreciated that the device 800 may be implemented as at least a part of, for example, a network device or a terminal device.

As shown in FIG. 7, the device 800 includes: a communicating means 830 and a processing means 850. The processing means 850 includes a data processor (DP) 810, and a memory (MEM) 820 coupled to the DP 810. The communicating means 830 is coupled to the DP 810 in the processing means 850. The MEM 820 stores a program (PROG) 840. The communicating means 830 is for communications with other devices, which may be implemented as a transceiver for transmitting/receiving signals.

In some embodiments, the device 800 acts as a network device, the processing means 850 may be configured to perform signal processing to an input signal and obtain an output signal, and the communicating means 830 may be configured to transmit the output signal or receive an output signal transmitted by a terminal device.

In some other embodiments, the device 800 acts as a terminal device, the processing means 850 may be configured to perform signal processing to an input signal and obtain an output signal, and the communicating means 830 may be configured to transmit the output signal or receive an output signal transmitted by a network device.

The PROG 840 is assumed to include program instructions that, when executed by the associated DP 810, enable the device 800 to operate in accordance with the embodiments of the present disclosure, as discussed herein with the above methods. The embodiments herein may be implemented by computer software executable by the DP 810 of the device 800, or by hardware, or by a combination of software and hardware. A combination of the data processor 810 and MEM 820 may form processing means 850 adapted to implement various embodiments of the present disclosure.

The MEM 820 may be of any type suitable to the local technical environment and may be implemented using any suitable data storage technology, such as semiconductor based memory devices, magnetic memory devices and systems, optical memory devices and systems, fixed memory and removable memory, as non-limiting examples. While only one MEM is shown in the device 800, there may be several physically distinct memory modules in the device 800. The DP 810 may be of any type suitable to the local technical environment, and may include one or more of general purpose computers, special purpose computers, microprocessors, digital signal processors (DSPs) and processors based on multicore processor architecture, as non-limiting examples. The device 800 may have multiple processors, such as an application specific integrated circuit chip that is slaved in time to a clock which synchronizes the main processor.

It will be appreciated that embodiments of the invention described herein may be comprised of one or more conventional processors and unique stored program instructions that control the one or more processors to implement, in conjunction with certain non-processor circuits, some, most, or all of the functions of generating a multicarrier communication signal having a reduced crest factor as described herein. The non-processor circuits may include, but are not limited to, a radio transmitter, signal drivers, clock circuits, power source circuits, and user input devices. As such, these functions may be interpreted as blocks of a method for generating a signal having a reduced crest factor. Alternatively, some or all functions could be implemented by a state machine that has no stored program instructions, or in one or more application specific integrated circuits (ASICs), in which each function or some combinations of certain of the functions are implemented as custom logic. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

For example, one or more of the examples described herein may be implemented in a field programmable gate array (FPGA), typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Generally, various embodiments of the present disclosure may be implemented in hardware or special purpose circuits, software, logic or any combination thereof. Some aspects may be implemented in hardware, while other aspects may be implemented in firmware or software which may be executed by a controller, microprocessor or other computing device. While various aspects of embodiments of the present disclosure are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

By way of example, embodiments of the present disclosure can be described in the general context of machine-executable instructions, such as those included in program modules, being executed in a device on a target real or virtual processor. Generally, program modules include routines, programs, libraries, objects, classes, components, data structures, or the like that perform particular tasks or implement particular abstract data types. The functionality of the program modules may be combined or split between program modules as desired in various embodiments. Machine-executable instructions for program modules may be executed within a local or distributed device. In a distributed device, program modules may be located in both local and remote storage media.

Program code for carrying out methods of the present disclosure may be written in any combination of one or more programming languages. These program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may execute entirely on a machine, partly on the machine, as a stand-alone software package, partly on the machine and partly on a remote machine or entirely on the remote machine or server.

The above program code may be embodied on a machine readable medium, which may be any tangible medium that may contain, or store a program for use by or in connection with an instruction execution system, apparatus, or device. The machine readable medium may be a machine readable signal medium or a machine readable storage medium. The machine readable medium may include but not limited to an electronic, magnetic, optical, electromagnetic, infrared, or semiconductor system, apparatus, or device, or any suitable combination of the foregoing.

More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

In the context of this disclosure, the device may be implemented in the general context of computer system-executable instructions, such as program modules, being executed by a computer system. Generally, program modules may include routines, programs, objects, components, logic, data structures, and so on that perform particular tasks or implement particular abstract data types. The device may be practiced in distributed cloud computing environments where tasks are performed by remote processing devices that are linked through a communications network. In a distributed cloud computing environment, program modules may be located in both local and remote computer system storage media including memory storage devices.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment. Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

In the context of this disclosure, the device may be implemented in the general context of computer system-executable instructions, such as program modules, being executed by a computer system. Generally, program modules may include routines, programs, objects, components, logic, data structures, and so on that perform particular tasks or implement particular abstract data types. The device may be practiced in distributed cloud computing environments where tasks are performed by remote processing devices that are linked through a communications network. In a distributed cloud computing environment, program modules may be located in both local and remote computer system storage media including memory storage devices.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the present disclosure, but rather as descriptions of features that may be specific to particular embodiments. Certain features that are described in the context of separate embodiments may also be implemented in combination in a single embodiment.

Conversely, various features that are described in the context of a single embodiment may also be implemented in multiple embodiments separately or in any suitable sub-combination.

Although the present disclosure has been described in language specific to structural features and/or methodological acts, it is to be understood that the present disclosure defined in the appended claims is not necessarily limited to the specific features or acts described above. Rather, the specific features and acts described above are disclosed as example forms of implementing the claims.

What is claimed is:

1. A Doherty Power Amplifier comprising:
    a first amplifier;
    a second amplifier;
    a first transmission device configured to feed first even order harmonic components generated at a drain of the first amplifier to a drain of the second amplifier, and then short the first even order harmonic components to ground; and
    a second transmission device configured to feed second even order harmonic components generated at the drain of the second amplifier to the drain of the first amplifier, and then short the second even order harmonic components to ground.

2. The Doherty Power Amplifier according to claim 1, wherein the first transmission device comprises a first quarter wave length transmission line configured to:
    couple the drain of the first amplifier and the drain of the second amplifier; and
    feed the first even order harmonic components to the drain of the second amplifier.

3. The Doherty Power Amplifier according to claim 2, wherein the first transmission device further comprises:
    a second quarter wavelength transmission line configured to couple the drain of the second amplifier and an output terminal of the second amplifier; and
    a third quarter wavelength transmission line configured to couple the output terminal of the second amplifier and ground by connecting in series with a first capacitor;
    wherein the first even order harmonic components are shorted to ground through a signal path via the first quarter wavelength transmission line, the second quarter wavelength transmission line, the third quarter wavelength transmission line, and the first capacitor.

4. The Doherty Power Amplifier according to claim 2, wherein the second transmission device comprises the first quarter wavelength transmission line, wherein the first quarter wavelength transmission line is further configured to feed the second even order harmonic components to the drain of the first amplifier.

5. The Doherty Power Amplifier according to claim 4, wherein the second transmission device further comprises:
    a fourth quarter wavelength transmission line configured to couple the drain of the first amplifier and an output terminal of the first amplifier; and
    a fifth quarter wavelength transmission line configured to couple the output terminal of the first amplifier and ground by connecting in series with a second capacitor;
    wherein the second even order harmonic components are shorted to ground through a signal path via the first quarter wavelength transmission line, the fourth quarter wavelength transmission line, the fifth quarter wavelength transmission line, and the second capacitor.

6. The Doherty Power Amplifier according to claim 5, wherein:
    the first odd order harmonic components generated at the drain of the first amplifier are shorted to ground through a signal path via the fourth quarter wavelength transmission line, the fifth quarter wavelength transmission line, and the second capacitor;
    the second odd order harmonic components generated at the drain of the second amplifier are shorted to ground through a signal path via the second quarter wavelength transmission line, the third quarter wavelength transmission line, and the first capacitor.

7. The Doherty Power Amplifier according to claim 5, wherein the Doherty Power Amplifier further comprises a combiner configured to combine a first output signal at the output terminal of the first amplifier and a second output signal at the output terminal of the second amplifier.

8. The Doherty Power Amplifier according to claim 7, wherein the combiner comprises a sixth quarter wavelength transmission line configured to couple the output terminal of the first amplifier and the output terminal of the second amplifier by connecting in series with a third capacitor.

9. The Doherty Power Amplifier according to claim 5, wherein the Doherty Power Amplifier further comprises a hybrid coupler configured to:
    split an input radio frequency signal into two signals; and
    feed the two signals to the first amplifier and the second amplifier with predetermined power ratio, respectively.

10. A method at a Doherty Power Amplifier that comprises a first amplifier and a second amplifier, the method comprising:
    feeding first even order harmonic components generated at a drain of the first amplifier to a drain of the second amplifier, and then shorting the first even order harmonic components to ground; and
    feeding second even order harmonic components generated at the drain of the second amplifier to the drain of the first amplifier, and then shorting the second even order harmonic components to ground.

11. The method according to claim 10, wherein the method further comprises:
    feeding the first even order harmonic components to the drain of the second amplifier by a first quarter wavelength transmission line coupling the drain of the first amplifier and the drain of the second amplifier; and
    feeding the second even order harmonic components to the drain of the first amplifier by the first quarter wavelength transmission line.

12. The method according to claim 11, wherein the method further comprises shorting the first even order harmonic components to ground through a signal path via the first quarter wavelength transmission line, a second quarter wavelength transmission line, a third quarter wavelength transmission line, and a first capacitor, wherein:
    the second quarter wavelength transmission line is configured to couple the drain of the second amplifier and an output terminal of the second amplifier; and
    the third quarter wavelength transmission line is configured to couple the output terminal of the second amplifier and ground by connecting in series with the first capacitor.

13. The method according to claim 12, wherein the method further comprises shorting the second even order harmonic components to ground by the first quarter wavelength transmission line, a fourth quarter wavelength transmission line, a fifth quarter wavelength transmission line, and a second capacitor, wherein:

the fourth quarter wavelength transmission line is configured to couple the drain of the first amplifier and an output terminal of the first amplifier; and the fifth quarter wavelength transmission line is configured to couple the output terminal of the first amplifier and ground by connecting in series with the second capacitor.

14. The method according to claim 13, wherein the method further comprises:

shorting first odd order harmonic components generated at the drain of the first amplifier to ground through a signal path via the fourth quarter wavelength transmission line, the fifth quarter wavelength transmission line, and the second capacitor;

shorting second odd order harmonic components generated at the drain of the second amplifier to ground by the second quarter wavelength transmission line, the third quarter wavelength transmission line, and the first capacitor.

15. The method according to claim 13, wherein the method further comprise combining a first output signal at the output terminal of the first amplifier and a second output signal at the output terminal of the second amplifier.

16. The method according to claim 15, wherein the method further comprises:

combining the first output signal and the second output signal by a sixth quarter wavelength transmission line, which is configured to couple the output terminal of the first amplifier and the output terminal of the second amplifier by connecting in series with a third capacitor to perform impedance inversion.

17. The method according to claim 13, wherein the method further comprises:

splitting an input radio frequency signal into two signals; and feeding the two signals to the first amplifier and the second amplifier with predetermined power ratio, respectively.

18. A device comprising:

a Doherty Power Amplifier, wherein the Doherty Power Amplifier comprises:

a first amplifier;

a second amplifier;

a first transmission device configured to feed first even order harmonic components generated at a drain of the first amplifier to a drain of the second amplifier, and then short the first even order harmonic components to ground; and a second transmission device configured to feed second even order harmonic components generated at the drain of the second amplifier to the drain of the first amplifier, and then short the second even order harmonic components to ground.

19. The device of claim 18, wherein the first transmission device comprises a first quarter wave length transmission line configured to:

couple the drain of the first amplifier and the drain of the second amplifier; and feed the first even order harmonic components to the drain of the second amplifier.

20. The device of claim 19, wherein the first transmission device further comprises:

a second quarter wavelength transmission line configured to couple the drain of the second amplifier and an output terminal of the second amplifier; and a third quarter wavelength transmission line configured to couple the output terminal of the second amplifier and ground by connecting in series with a first capacitor;

wherein the first even order harmonic components are shorted to ground through a signal path via the first quarter wavelength transmission line, the second quarter wavelength transmission line, the third quarter wavelength transmission line, and the first capacitor.

* * * * *